United States Patent [19]

Morton et al.

[11] 4,035,826

[45] July 12, 1977

[54] REDUCTION OF PARASITIC BIPOLAR EFFECTS IN INTEGRATED CIRCUITS EMPLOYING INSULATED GATE FIELD EFFECT TRANSISTORS VIA THE USE OF LOW RESISTANCE SUBSTRATE CONTACTS EXTENDING THROUGH SOURCE REGION

[75] Inventors: George Ira Morton, Belle Mead; Robert Charles Heuner, Bound Brook, both of N.J.

[73] Assignee: RCA Corporation, New York, N.Y.

[21] Appl. No.: 660,348

[22] Filed: Feb. 23, 1976

[51] Int. Cl.² .................. H01L 27/02; H01L 29/78; H03K 3/353

[52] U.S. Cl. .................................... 357/42; 357/23; 357/41; 307/304

[58] Field of Search ..................... 357/23, 41, 42; 307/304

[56] References Cited

U.S. PATENT DOCUMENTS 3,821,781  6/1974  Chang et al. .................. 357/42

OTHER PUBLICATIONS

Non-Latching Integrated Circuits; RCA Technical Notes; by William Dennehy; MO876, Feb. 12, 1971, pp. 1 to 4.

*Primary Examiner*—Andrew J. James
*Attorney, Agent, or Firm*—H. Christoffersen; R. P. Williams; Sanford J. Asman

[57] ABSTRACT

Low resistance substrate contacts extending through the source region of an insulated gate field effect transistor (IGFET) will reduce parasitic bipolar effects in an integrated circuit. Such low resistance contacts may be made by diffusing impurities of a type opposite to the conductivity type of the source region through spaced areas of the source region thereby to provide low resistance paths between all points in the source and the underlying substrate. The low resistance contacts prevent large voltage drops in the substrate underlying the source thereby preventing "latch-up" of the parasitic devices formed during the manufacture of the integrated circuit.

10 Claims, 9 Drawing Figures

REDUCTION OF PARASITIC BIPOLAR EFFECTS IN INTEGRATED CIRCUITS EMPLOYING INSULATED GATE FIELD EFFECT TRANSISTORS VIA THE USE OF LOW RESISTANCE SUBSTRATE CONTACTS EXTENDING THROUGH SOURCE REGION

The present invention relates to an improvement in the design of integrated circuits employing insulated gate field effect transistors (IGETs) to provide low resistance contact between the power supplies and the substrates of the devices at spaced regions extending through the sources of such devices, thereby to reduce the bulk resistance underlying the source regions. More particularly, the present invention provides an improved means for prevention of "latch-up" due to parasitic bipolar transistors forming PNPN structures in integrated circuits employing IGFETs.

In the formation of integrated circuits, particularly integrated circuits employing IGFETs, the process of creating the source, drain, and P-well diffusions also creates parasitic bipolar devices, such as diodes and transistors. The parasitic elements are connected to the basic circuit nodes. Inasmuch as the parasitic devices are formed along with the desired devices in the manufactured process, their presence cannot be eliminated. Accordingly, circuit designers must be aware of the presence of the parasitic elements and avoid subjecting the integrated circuits to conditions conductive to their operation.

In the drawings:

FIG. 4a is a top view of a COS/MOS integrated circuit inverter including the present invention;

FIG. 4b is a sectional view of the inverter of FIG. 4a taken along the lines 4b —4b of FIG. 4a.

Figure 1:
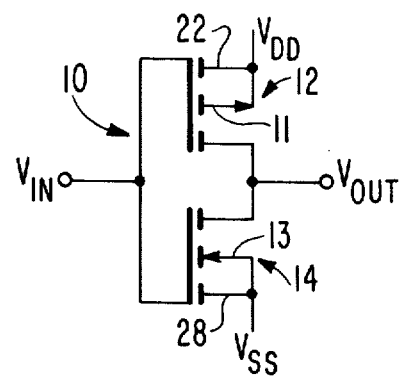
FIG. 1 is a schematic diagram of COS/MOS inverter circuit employing one P-channel and one N-channel enhancement type device.

In the design of complementary-symmetry/metal-oxide-semiconductor (COS/MOS) integrated circuits there are certain basic circuits which are used repeatedly. Among the most basic circuits is the inverter, which generally consists of one P-channel and one N-channel enhancement type MOS transistor, as shown schematically in FIG. 1. The source 22 and substrate 11 of the P-channel transistor 12 are connected to the positive power supply voltage $V_{DD}$ and the source 28 and substrate 13 of the N-channel transistor 14 are connected to the negative power supply, $V_{SS}$, the lowest voltage potential in the circuit. $V_{SS}$ may be ground if no negative supply is used.

Figure 2:
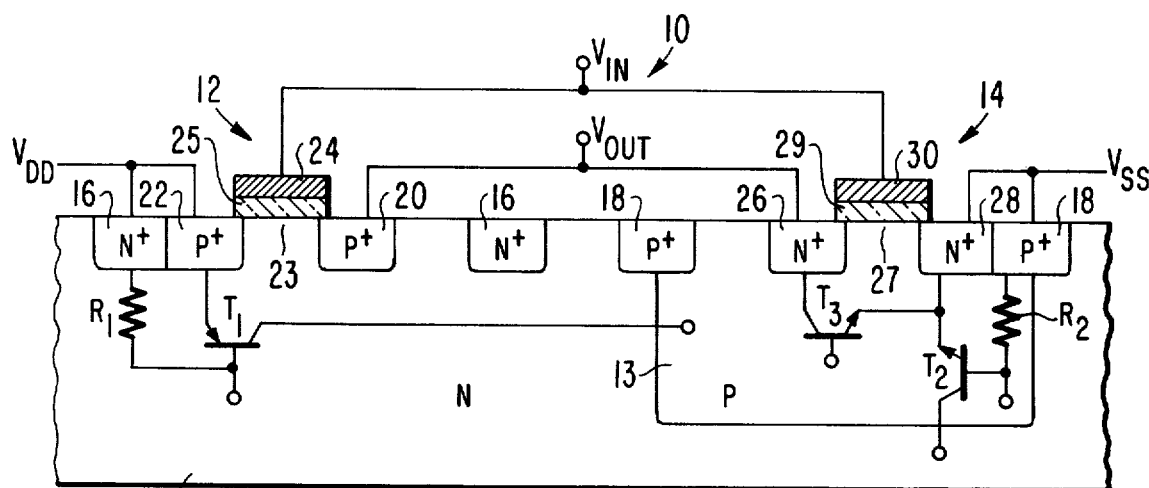
FIG. 2 is a schematic cross-sectional view of a COS/MOS inverter showing the diffused regions which form the integrated circuit together with a schematic diagram of the parasitic bipolar elements formed in the integrated circuit.

Referring now to FIG. 2, a cross-sectional view of a COS/MOS integrated circuit inverter 10, is shown. The inverter 10 is comprised of a P-channel transistor 12 and an N-channel transistor 14. The P-channel transistor 12 is formed in an N-type substrate 11 and is comprised of a P+ source region 22 and a P+ drain region 20, with a channel region 23 therebetween. A gate contact 24 formed of a conductive material, such as metal or highly doped polycrystalline silicon, called polysilicon, overlies the channel region 23 from which it is separated by an insulator 25, usually of silicon dioxide. An N+ guardband 16 surrounds the P-channel transistor 12.

The N-channel transistor 14 is formed in a P-well 13 which extends into the N-type substrate 11. The N-channel transistor 14 is comprised of an N+ source region 28 and an N+ drain region 26, with a channel region 27 therebetween. A gate contact 30, formed of a conductive material, such as metal or polysilicon, overlies the channel region 27 from which it is separated by an insulator 29, usually of silicon dioxide. A P+ guardband 18 surrounds the N-channel transistor 14.

The gate contacts 24, 30 are adapted to be electrically connected to form the input to the inverter 10; the drains 20, 26 are adapted to be electrically connected to form the output of the inverter 10; and the sources 22, 28 and their aassociated guardbands 16, 18 are connected together and to the positive and negative voltage supplies, respectively.

When the input voltage, $V_{in}$, of the inverter 10 is at $V_{SS}$, the P-channel transistor 12 is turned "on" and the N-channel transistor 14 is turned "off" thereby driving the output voltage, $V_{out}$, to $V_{DD}$. Similarly, when the input voltage, $V_{in}$, is at $+V_{DD}$, the P-channel transistor 12 is turned "off" and the N-channel transistor 14 is turned "on" thereby driving the output voltage, $V_{out}$, to $V_{SS}$.

Figure 3:
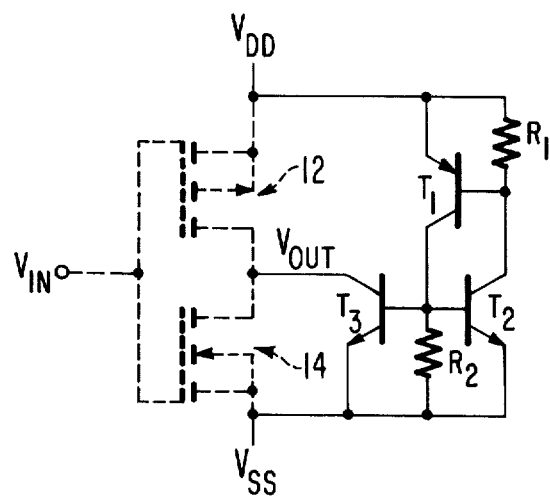
FIG. 3 is a schematic diagram of the circuit formed by the parasitic elements of FIG. 2.

It has been found that operation of COS/MOS integrated circuits outside their recommended ratings can force the devices into various "latch-up" mechanisms which are generally destructive. "Latch-up" is considered to be an operational mode in which a relatively high current path between the positive power supply, $V_{DD}$, and the negative power supply, $V_{SS}$, is created by the operation of parasitic devices in the integrated circuit. In the COS/MOS circuit shown in FIG. 2, parasitic bipolar devices created in the manufacture of the inverter 10 are shown schematically. These devices include a lateral PNP transistor $T_1$, a vertical NPN transistor $T_2$, and a lateral NPN transistor $T_3$, together with associated internal resistors, $R_1$ and $R_2$. The parasitic bipolar transistors, $T_1$, $T_2$, and $T_3$, are formed by the PN junctions within the COS/MOS circuit, and the parasitic resistors $R_1$ and $R_2$ represent the bulk resistance present in the substrate 11 and the P-well 13, respectively. FIG. 3 is the schematic diagram of an equivalent circuit of the structure shown in FIG. 2 with the COS/MOS circuit of FIG. 1 shown in shadow.

A parasitic SCR, formed by transistors $T_1$ and $T_2$ and resistors $R_1$ and $R_2$, can be turned on by forward biasing the emitter-base junctions of the lateral PNP transistor, $T_1$, and the verticl NPN transistor, $T_2$. The emitter-base junction of $T_1$ is forward biased whenever there is a voltage drop across $R_1$ corresponding to a forward biased diode drop, i.e., about 0.7 volts, and the emitter-base junction of $T_2$ is forward biased whenever there is a voltage drop across $R_2$ corresponding to a forward biased diode drop. Therefore, the emitter-base junctions of transistors, $T_1$ and $T_2$, can be forward biased by injecting current through the parasitic bulk resistors, $R_1$ and $R_2$, and the transistors, $T_1$ and $T_2$ will be turned on whenever the current injected through their associated bulk resistances, $R_1$ and $R_2$, respectively, when multiplied by that resistance, is equal to or greater than a forward biased diode drop.

Under normal operating conditions no current is injected through the bulk resistors, $R_1$ and $R_2$. However, there are various abnormal operating conditions to which the integrated circuit may be subjected which will cause current to be injected. For example, a voltage transient which causes the power supply voltage, $V_{DD}$, to exceed the approved operating region for the integrated circuit may cause current to be injected into the P-well 13. This may occur when the P-channel transistor 12 is on due to a low input to the inverter 10. The drain 26 of the N-channel transistor 14 will be at $V_{DD}$. A transient may cause the reverse breakdown voltage of the PN junction formed between the drain 26 and the P-well 13 to be exceeded, causing current to be injected into the P-well 13. Such current will find a path to $V_{SS}$ through the P+ guardband 18. During this occurrence, the voltage potential of the course 28 of transistor 14 is held at $V_{SS}$. If there is an adequate voltage drop between the P-well 13 and the source 28, determined by the amount of current injected and the size of $R_2$, the base-emitter junctions of transistors $T_2$ and $T_3$ will be forward biased. Additional current may be drawn through the collector of $T_2$ from $V_{DD}$ via $R_1$, and additional current may be drawn through the collector of $T_3$ directly through the drain 26 of transistor 14. The integrated circuit will be in a "latch-up" mode.

While one way of initiating a "latch-up" condition of the parasitic bipolar transistors has been described, others exist. Generally, the likelihood of "latch-up" of the parasitic bipolar transistors can be reduced by reducing the parasitic resistances represented by $R_1$ and $R_2$. Then, the current which flows between $V_{DD}$ and the N substrate 11 or between $V_{SS}$ and the P-well 13 would have to be increased in order to achieve a voltage drop across the parasitic resistances, $R_1$ and $R_2$, sufficient to turn on the transistors, $T_1$ and $T_2$, and cause a "latch-up"of the parasitic bipolar transistors to occur.

Figures 4A, 4B:
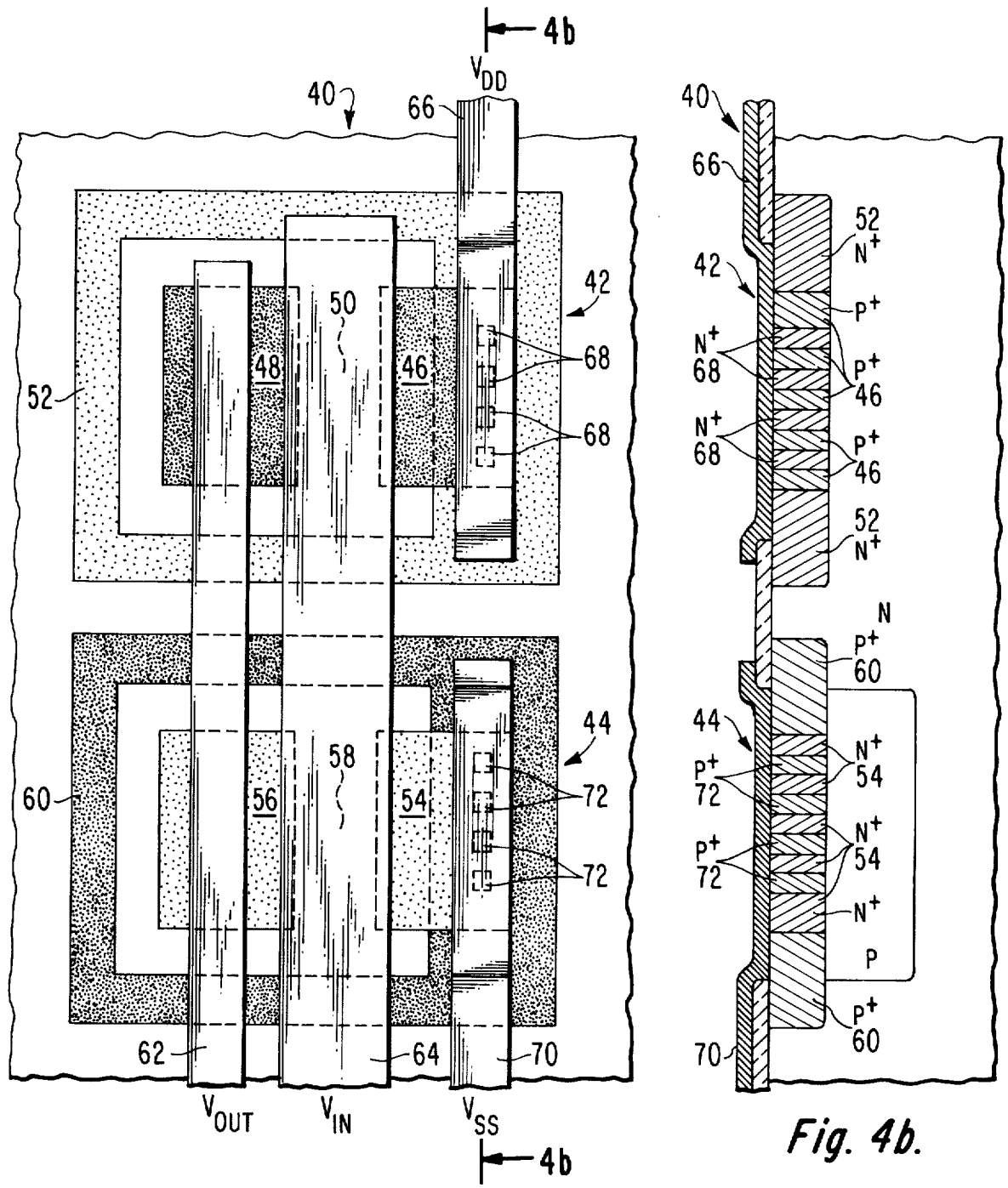

Referring generally to FIGS. 4a and 4b, top plan and cross-sectional views of an inverter 40 formed in accordance with the present invention are shown. In FIG. 4a, dark stippled areas represent P+regions, while light stippled areas represent N+regions. The inverter 40 is an integrated circuit formed of a P-channel IGFET 42 and an N-channel IGFET 44. The P-channel IGFET 42 is comprised of a P+source and a P+drain 48, with an insulated gate region 50 therebetween. Surrounding the P-channel IGFET 42 is an N+ guardband 52. Similarly, the N-channel IGFET 44 is comprised of an N+ source 54 and an N+ drain 56 with an insulated gate region 58 therebetween. Surrounding the N-channel IGFET 44 is a P+ guardband 60.

The drain regions 48, 56 are connected by a metallic output bus 62, usually of aluminum, which contacts each of the drain regions 48, 56, and forms the output of the inverter 40. A metallic input bus 64, usually of aluminum, overlies the gate regions 50, 58 of the transistors 42, 44 and forms the input of the inverter 40. The input bus 64 is separated from the gate regions 50, 58 by insulators, usually of silicon dioxide.

Power is supplied to the inverter 40 by a positive power supply, $V_{DD}$ (not shown), on a positive supply power bus 66 which contacts both the source 46 of the P-channel device 42 and the N+guardband 52 surrounding the device 42. In the source 46, underlying the positive supply power bus 66 are a series of rectangular N+ contact regions 68 whose purpose is to provide a low resistance contact to the substrate at spaced intervals along the source 46. These contact regions 68 reduce the bulk parasitic resistance in the integrated circuit by paralleling portions of the bulk resistance. They will be called source region interior contacts.

A negative power supply bus 70 connects the source 54 of the N-channel device 44 to the negative power supply, $V_{SS}$ (not shown). In the source 54, underlying the negative power supply bus 70 are a series of rectangular P+contact regions 72 which comprises the source region interior contacts of the N-channel device 44. The purpose of the source region interior contacts 68, 72 in the sources 46, 54 is to provide a low resistance path between the power supplies, $V_{DD}$ and $V_{SS}$, and all points in the substrates of the devices 42, 44. The high resistance path from the edges of the sources, 46, 54 to the substrates beneath the sources 46, 54 are thereby eliminated. Consequently, the resistance $R_1$ and $R_2$ shown in FIG. 3 are decreased considerably when compared to transistors having no source region interior contacts. The lower the parasitic resistances $R_1$ and $R_2$ can be made, the greater the current flow there must be to have the same voltage drop across the resistance. Accordingly, by reducing the resistances $R_1$ and $R_2$, it becomes more difficult to cause the parasitic bipolar transistors $T_1$, $T_2$, $T_3$, to enter a "latch-up" condition.

In order to manufacture an integrated circuit employing the present invention, one starts with a wafer of silicon. In manufacturing a COS/MOS integrated circuit the wafer is generally N-type and generally has a surface oriented substantially parallel to the (100) crystallographic plane in the wafer. Impurities are introduced into the wafer by using standard photolithographic techniques to define openings into which the impurities are diffused or ion implanted in accordance with standard semiconductor processing techniques. Generally, impurities may be diffused into the wafer, with the penetration depth of the diffusion controlled by the diffusion time and temperature, as is well known in the art.

Figure 5:
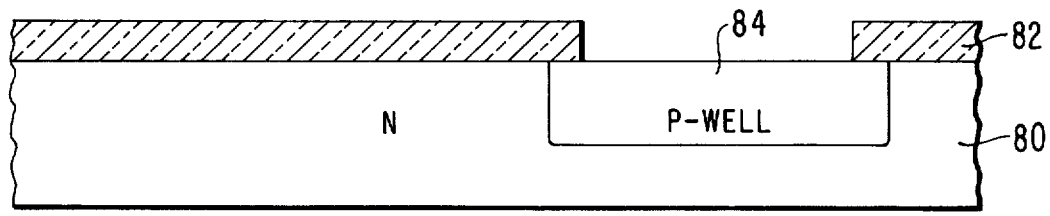
FIGS. 5-8 are cross-sectional views showing the steps in the manufacture of a COS/MOS integrated circuit in accordance with the present invention.

Referring to FIG. 5 an N-type wafer 80 has an oxide layer 82 formed thereon by using standard MOS processing techniques. After completing of the growth of the oxide layer 82, a "window" is opened in the oxide layer 82 using standard photolithographic techniques in each position where a P-well is to be formed. P-type impurities are ion implanted through the openings in the oxide layer 82 resulting in a shallow region having P-type impurities underlying each opened area in the oxide layer 82. Following the ion implantation step, the wafer 80 is placed in a diffusion furnace at a temperature of about 1200° C for about 16 hours to complete the drive-in diffusion of the P-well 84.

Figure 6:
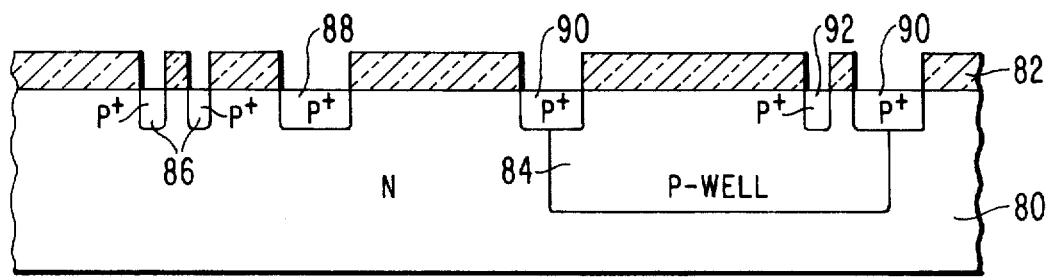

Next, the oxide layer 82 is reformed over the surface of the wafer 80, and, using a second photomask, areas are defined in the oxide layer 82 which overlie areas in the wafer 80 where P+ regions will be formed for the drain and source of the P-channel devices and for the guardband and source region interior contacts of the N-channel devices. The defined areas of the oxide layer 82 are removed and an acceptor impurity is introduced into the wafer 80 through the openings thus formed. Referring to FIG. 6 the diffusion of the P+ material is shown to have taken place in accordance with standard techniques. At the point illustrated by FIG. 6 the wafer 80 has formed therein a P-well 84, a P+ source 86, and P+ drain 88 of a P-channel device as well as a P+ guardband 90 surrounding the P-well 84 and a series of P+ source region interior contacts 92 in accordance with the present invention.

Following the diffusion of the P+ regions, the oxide layer 82 is reformed over the P+ regions. Using a third photomask, areas are defined in the oxide layer which overlie areas in the wafer 80 where N+ regions will be formed for the drain and source of the N-channel devices and for the guardband and source region interior contacts of the P-channel devices. The defined areas of the oxide layer 82 are then removed, and a donor impurity is introduced into the wafer 80 through the openings thus formed.

Figure 7:
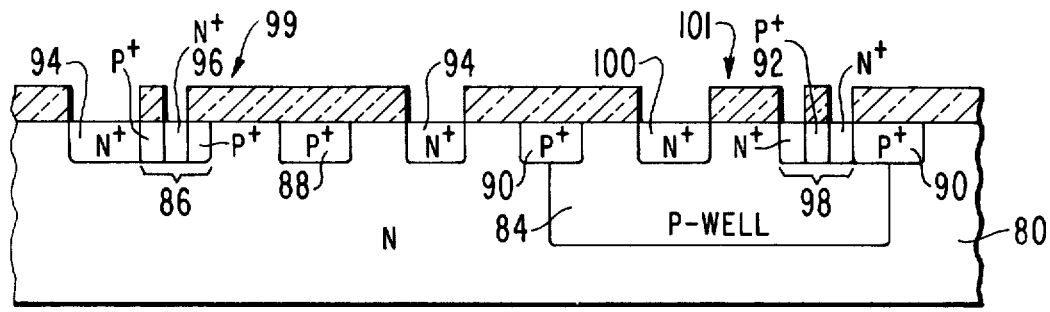

Referring generally to FIG. 7, the wafer 80 is shown following the completion of the definition and diffusion of the N+ regions. The wafer 80 includes all of the N+ regions in addition to the P+ regions already described. In particular, the N+ guardband 94 which surrounds a P-channel transistor 99 having source 86 and drain 88 is shown. Also, N+ source region interior contacts 96 extend through the source 86 to the substrate 80. The section shown in FIG. 7 has been chosen to extend through one of the source region interior contacts 92 for the N-channel transistor 101 and one of the source region interior contacts 96 of the P-channel transistor 99. Accordingly, the source region interior contacts 92, 96 appear to separate the source regions 98, 86 of the transistors 101, 99. It should be recognized that the source region interior contacts 92, 96, may, but do not necessarily extend along the full length of the source regions 98, 86, i.e., in a direction normal to the plane of the drawing.

Figure 8:
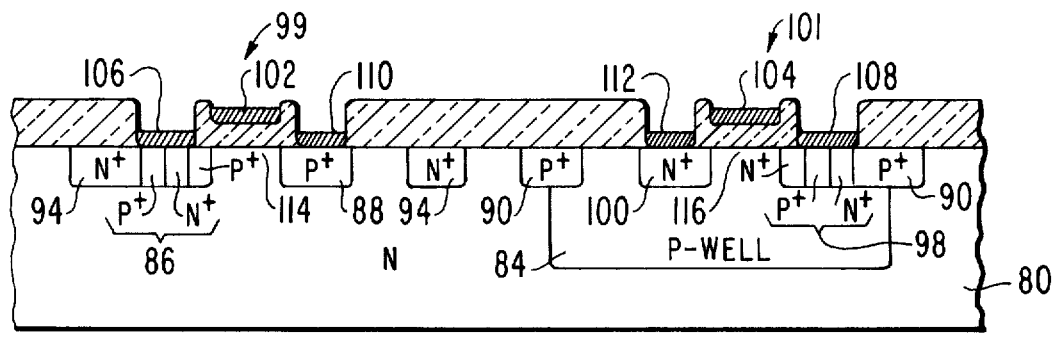

Referring to FIG. 8, a cross section of the completed integrated circuit is shown. Metal contacts 102, 104 have been added over insulators which overlie the gates 114, 116. Metallic buses 106, 108 have been added over the sources 86, 98, and metallic buses 110 and 112 have been added over the drains 88, 100 of the P and N channel transistors 99, 101, respectively. The metal contacts and buses are added in a conventional manner such as by vapor deposition. Then they are photolithographically defined in a manner well known in the art.

While the present invention has been described, with reference to FIG. 4, as having rectangular shaped contact regions 68, 72 extending into the source 46, 54 of each transistor 42, 44, it should be recognized by one skilled in the art that the form of the source region interior contacts 68, 72 may be varied as desired. In particular, a single source region interior contact may extend along the full length of a source region rather than in separate rectangular regions or, alternatively, finger-like projections may extend into the source region from the adjacent guardband. Finally, while the source region interior contacts have been referred to as comprising either N+ or P+ regions due to the requirement that the present state of the art requires a highly conductive semiconductor material in order to make reliable contact to a metal, the present invention merely requires a low resistivity contact to the substrate of the device extending through the source of the device.

What is claimed is:

1. An integrated circuit device comprising:
   a. a body of semiconductor material predominantly of one conductivity type;
   b. a pair of spaced regions each having a conductivity type opposite that of said body, each of said regions extending into said body from a surface thereof;
   c. an insulating region on the surface of said body extending at least between said pair of spaced regions;
   d. a conductive gate overlying said insulating region, said gate extending over said insulating region at least between said pair of spaced regions;
   e. at least one contact region extending through a portion of one of said spaced regions into said body, said contact region being completely surrounded by said spaced region at said surface, and providing a low resistivity contact to said body from the surface of said device.

2. The integrated circuit device of claim 1, wherein said contact region is comprised of semiconductor material.

3. The integrated circuit device of claim 2 in which said contact regions have the same conductivity type as said body.

4. The integrated circuit device of claim 1 further comprising means for making electrical contact to said spaced region containing said contact regions, also making electrical contact to said contact regions.

5. The integrated circuit device of claim 1 further comprising:
   a. a well region extending into said body from the surface thereof having a conductivity type opposite that of said body;
   b. a pair of spaced regions within said well region, each of said spaced regions having the same conductivity type as the body;
   c. an insulating region on the surface of said well region extending at least between said pair of spaced regions contained within said well region;
   d. a conductive gate overlying said insulating region, said gate extending over said insulating region at least between said pair of spaced regions;
   e. at least one contact region extending through a portion of one of said spaced regions, said contact region being completely surrounded on said surface by said spaced region, into said well from the surface of said device.

6. The integrated circuit device of claim 5 wherein said contact regions extending into said well are comprised.

7. The integrated circuit device of claim 6 in which said contact regions extending into said well have the same conductivity type as said well.

8. The integrated circuit of claim 7 in which said contact regions are highly doped semiconductive material of conductivity type opposite that of the spaced regions through which they extend.

9. The integrated circuit device of claim 5 in which said contact regions provide a low resistivity contact to said well region from the surface of said device.

10. The integrated circuit device of claim 5 further comprising means for making electrical contact to said spaced region within said well containing said contact regions, also making electrical contact to said contact regions.

* * * * *